US006880116B2

(12) United States Patent
Man et al.

(10) Patent No.: US 6,880,116 B2
(45) Date of Patent: Apr. 12, 2005

(54) SYSTEM FOR TESTING MULTIPLE DEVICES ON A SINGLE SYSTEM AND METHOD THEREOF (75) Inventors: Albert Man, Richmond Hill (CA); Roy Schoonover, Mississauga (CA)

(73) Assignee: ATI Technologies, Inc., Ontario (CA)

( * ) Notice: Subject to any disclaimer, the term of this patent is extended or adjusted under 35 U.S.C. 154(b) by 402 days.

(21) Appl. No.: 09/995,312

(22) Filed: Nov. 27, 2001

(65) Prior Publication Data

US 2003/0101391 A1 May 29, 2003

(51) Int. Cl.[7] .............................................. G11C 29/00
(52) U.S. Cl. ...................................... 714/718; 714/724
(58) Field of Search .......................... 714/32, 712, 718, 714/724, 730; 324/158, 765

(56) References Cited

U.S. PATENT DOCUMENTS

| 4,504,783 | A | | 3/1985 | Zasio et al. | |
|---|---|---|---|---|---|
| 4,760,330 | A | * | 7/1988 | Lias, Jr. ........................ | 714/32 |
| 5,477,544 | A | * | 12/1995 | Botelho ....................... | 714/712 |
| 5,969,756 | A | | 10/1999 | Buckley et al. | |
| 6,128,757 | A | | 10/2000 | Yousuf et al. | |
| 6,294,908 | B1 | * | 9/2001 | Belmore et al. .......... | 324/158.1 |
| 6,357,026 | B1 | | 3/2002 | Hoang et al. | |
| 6,421,798 | B1 | * | 7/2002 | Lin et al. ..................... | 714/718 |
| 6,480,978 | B1 | * | 11/2002 | Roy et al. .................... | 714/724 |
| 6,539,510 | B1 | | 3/2003 | St. Pierre, Jr. et al. | |
| 6,559,671 | B2 | * | 5/2003 | Miller et al. ................ | 324/765 |
| 6,678,850 | B2 | * | 1/2004 | Roy et al. .................... | 714/730 |
| 6,691,270 | B2 | | 2/2004 | Blasco Allue et al. | |

* cited by examiner

Primary Examiner—David Ton
(74) Attorney, Agent, or Firm—Tolar, Larson & Abel, LLP (57) ABSTRACT A system and method for testing multiple components using a single host system is shown and described. A host system with a single advanced graphics port (AGP) is used to generate commands of a test routine to test a particular type of AGP processing component. A test fixture interfaces to the AGP port of the host system and provides the commands to each of a plurality of test components. The test components process the commands concurrently, generating results. The test fixture receives each of the results in turn and provides the results to the host system, allowing the host system to determine if the test components are functioning within particular parameters. The test fixture provides an interface to allow several test components to be tested as AGP master devices, over a single AGP port on the host system.

32 Claims, 5 Drawing Sheets

FIG. 5

SYSTEM FOR TESTING MULTIPLE DEVICES ON A SINGLE SYSTEM AND METHOD THEREOF

FIELD OF THE DISCLOSURE

The present invention relates generally to the testing of circuits and more particularly to testing multiple circuits.

BACKGROUND

Newly manufactured products are tested to ensure they conform to operating specification requirements. Depending on the type of product, various testing techniques are used. For example, for hardware devices, such as printed circuit boards, test fixtures are created to provide an input stimulus and monitor outputs of the device for proper responses. If, for each of the input stimulus, the output is as anticipated, the printed circuit board passes the test.

To adequately test a particular integrated circuit, the integrated circuit must be tested against operating conditions in which the integrated circuit will be used. General-purpose, automated test equipment is generally used to test integrated circuits, such as microprocessors, microcontrollers, video graphic processors, etc. A simulated design verification suite, based on a hardware description language, of an integrated circuit being tested is used to create a virtual environment to test the integrated circuit. While the automated test equipment provides flexibility such that various integrated circuits may be tested, it is generally a costly piece of equipment (e.g., approximately $2 Million Dollars U.S.). In addition, the development of the customized test program is somewhat time consuming, which adds additional costs to the overall automated testing process.

As an alternative to using automated test equipment, test fixtures may be used that simulate the real environment in which the integrated circuit will be used. For example, for a microprocessor, the test fixture may include a motherboard within a personal computer. While this technique works well for specific integrated circuits, it becomes costly when attempting to test multiple integrated circuits at the same time. Separate test fixtures are needed to test each integrated circuit. For particular integrated circuits, such as graphics cards that interface to an accelerated graphics port (AGP) socket of a motherboard. Since the AGP sockets are designed to only support a single master AGP graphics card at one time, every graphics card being tested must use dedicated test fixture with a single AGP socket and motherboard. From the above discussion it should be apparent that an improved system for testing multiple integrated cards is needed.

BRIEF DESCRIPTION OF THE DRAWINGS

Specific embodiments of the present disclosure are shown and described in the drawings presented herein. Various objects, advantages, features and characteristics of the present disclosure, as well as methods, operations and functions of related elements of structure, and the combination of parts and economies of manufacture, will become apparent upon consideration of the following description and claims with reference to the accompanying drawings, all of which form a part of this specification, and wherein:

DETAILED DESCRIPTION OF THE FIGURES

At least one embodiment of the present disclosure provides for a test fixture used for concurrently testing multiple devices. An information handling system is used to generate test commands for testing a plurality of devices, such as AGP graphics processing components. The information handling system includes a single host port for interfacing with the devices. The test fixture includes a tester port configured to mate with the host port. The test fixture also includes a plurality of sockets configured to receive devices of the plurality of devices. The devices have are configured to communicate with the host. The test fixture also includes a bridge component having a first interface coupled to the tester port and a plurality of additional interfaces connected to the plurality of sockets. The test fixture allows multiple devices to operate as master devices connected to the host port, for testing using the test commands and the information handling system.

Figure 1:
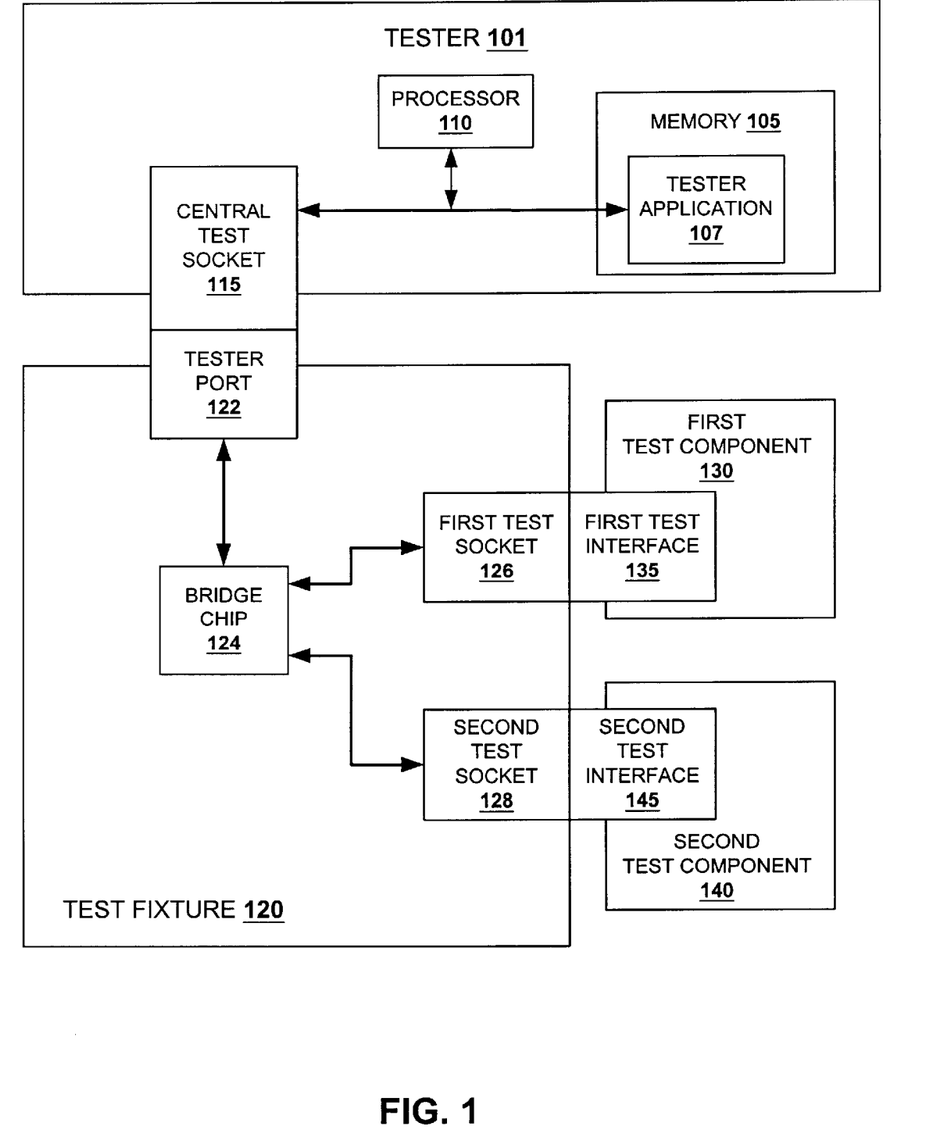
FIG. 1 is a block diagram illustrating a single test fixture coupled between a host system operating as a tester and multiple components being tested, according to one embodiment of the present disclosure.

Referring now to FIG. 1, a block diagram illustrating a test fixture connected between a single host system operating as a tester and multiple devices or components being tested is shown, according to one embodiment of the present disclosure. A component tester, shown as tester 101, runs test applications, such as tester application 107. Tester application 107 includes a test routine to provide commands for testing operations in a device, such as first test component 130 and second test component 140. Tester 101 includes a single host port, central test socket 115, for interfacing with tester port 122 of test fixture 120 to provide commands to a device, such as first test component 130 or second test component 140. Test fixture 120 interfaces into tester 101 and provides test commands from tester 101 to both first test component 130 and second test component 140.

Tester 101 uses a host processor, processor 110, to run test routines dictated by tester application 107. Tester 101 runs tester application 107 from memory 105. Tester application 101 includes a routine, or set of routines, for testing processes of devices, such as test components 130 and 140. The routine may include various at-speed tests of test components 130 and 140. At-speed routines are test routines which may test capabilities of a device, such as a graphics processor, included in test components 130 and 140, to process 3-dimensional graphics commands in a particular speed range in which test components 130 and 140 are expected to operate. At-speed routines can be used to test other devices, such as memory components, by forcing the component to process commands at a particular speed. Test components 130 and 140 may also include memory devices. Test routines may also include routines to test memory devices of test components 130 and 140, as well as any other circuitry, firmware or software used in the operation of test components 130 and 140. In one embodiment, the test routines include commands to test single portions or devices of test components 130 and 140. Memory 105 may include read-only memory, random access memory, floppy disk memory, hard-disk memory, magnetic tape memory, digital versatile disk (DVD) memory, compact disc (CD) memory, and/or any device used to store digital media. It should be appreciated that various types of integrated circuit components and memory devices may be used without departing from the scope of the present disclosure.

To adequately test performance of test components 130 and 140, tester 101 includes system components that function similar to components of a system in which first test component 130 and second test component 140 are designed to run. For example, tester 101 may include computer desktop components, laptop components, video gaming components or their functional equivalent. By testing test components 130 and 140 with tester 101, it can be determined how well test components 130 and 140 will function in their intended environment. However, only a single port, such as central test socket 115, may be available on tester 101 for interfacing with a circuit board or component. In one embodiment, test components 130 and 140 are graphics processors that are generally used as components of circuit boards or graphics cards, designed to interface with an accelerated graphics port (AGP) socket on an information handling system, such as tester 101. Test components 130 and 140 are each generally, though not necessarily, designed to function as part of AGP master devices. However, AGP specifications allow for only one master device to be interfaced with the AGP socket. Accordingly, tester 101 only includes a single AGP socket, such as central test socket 115.

Test fixture 120 provides an interface to central test socket 115 of tester 101, through tester port 122. A component of test fixture 120, bridge chip 124, receives commands from central test socket 115, through tester port 122. Bridge chip 124 provides commands to first and second test components 130 and 140, through device sockets, test sockets 126 and 128, respectively. First and second test components 130 and 140 include interface ports (not shown) for interfacing directly with test sockets 126 and 128, respectively. The bridge chip 124 is used to route test commands from tester port 122 to test sockets 126 and 128, as described further in reference to FIG. 5. In one embodiment, tester 101 uses tester application 107 to generate individual commands for each of test components 130 and 140. Each command may include an address identifier specifying first test component 130 or second test component 140. Individual portions of test components 130 and 140 may also be addressed, such as memory (not shown). In one embodiment, an AGP addressing scheme is used to generate the addresses. Bridge chip 124 then routes the commands to first test socket 126 or second test socket 128, dependent on the address identified. In one embodiment, test fixture 120 includes integrated components for supporting first and second test components 130 and 140. For example, test fixture 120 may include sets of integrated components, such separate sets of frame buffers or interface logic circuitry for first and second test components 130 and 140.

Alternatively, tester application 107 may be used to generate a single set of commands to be run on either first test component 130 or second test component 140. Bridge chip 124 receives the single set of commands and broadcasts the set of commands to both test sockets 126 and 128. In one embodiment, bridge chip 124 provides a first copy of the command set to first test socket 126, allowing the command set to start to be processed in first test component 130. Then the bridge chip 124 provides a copy of the received command set to second test socket 128, allowing the command set to be processed by second test component 140, concurrent with processing performed in first test component 130. In another embodiment, specific zones of addresses available to bridge chip 124 are used by tester application 107 to allow the tester 101 to provide commands to either test component 130 or 140. One zone of addresses may be used by bridge chip 124 to route commands to the first test component 130. A second zone of addresses may be used by the bridge chip to route commands to the second test component 140. The bridge chip 124 may use a third zone of addresses to send commands to both the first test component 130 and the second test component 140.

First test component 130 receives a set of commands through first interface 135, interfaced with first test socket 126 of test fixture 120. First test component 130 processes the received command set. Results from the command set, including processed data, a checksum, and the like, are returned to first test socket 126, through first interface 135. In one embodiment, first test component 130 includes individual portions, such as a graphics processing portion or a memory portion. The received command set allows particular portions of first test component 130 to be tested. In one embodiment, the particular portions of first test component 130 are tested at a speed at which first test component 130 is to be run. Similarly to first test component 130, second test component receives a set of commands from second test socket 128, through second interface 145. Second test component 140 processes the command set and returns any processing results to second test socket 128, through second interface 145. In one embodiment, the commands to the second test component 140 are provided at the same time as commands to the first test component 130.

Bridge chip 124 receives results from first test socket 126 and second test socket 128. Bridge chip 124 provides the received results to tester port 122. Tester 101 receives the results from tester port 122, through central test socket 115. Processor 110 runs tester application 107 to compare the results against known results to determine if test components 130 and 140 are operating within specification. In one embodiment, bridge chip 124 attaches separate addresses to the results received from first test component 130 and second test component 140. Tester application 107 may then use the attached addresses to identify which test component, first test component 130 or second test component 140, is associated with which results, allowing test components which do not meet specifications to be uniquely identified.

Components being tested, such as test components 130 and 140, may be considered invalid and discarded during testing. In one embodiment, tester 101 is used to program a handler (not shown) used to attach components, such as test components 130 and 140, to test fixture 120. Tester 101 may provide commands to the handler to place tested components in particular bins indicating parts that have passed or failed particular tests. The handler may also be used to replace tested parts with untested parts, automating the test system, as described in U.S. patent application Ser. No. 09/994,261 herein incorporated by reference.

Figure 2:
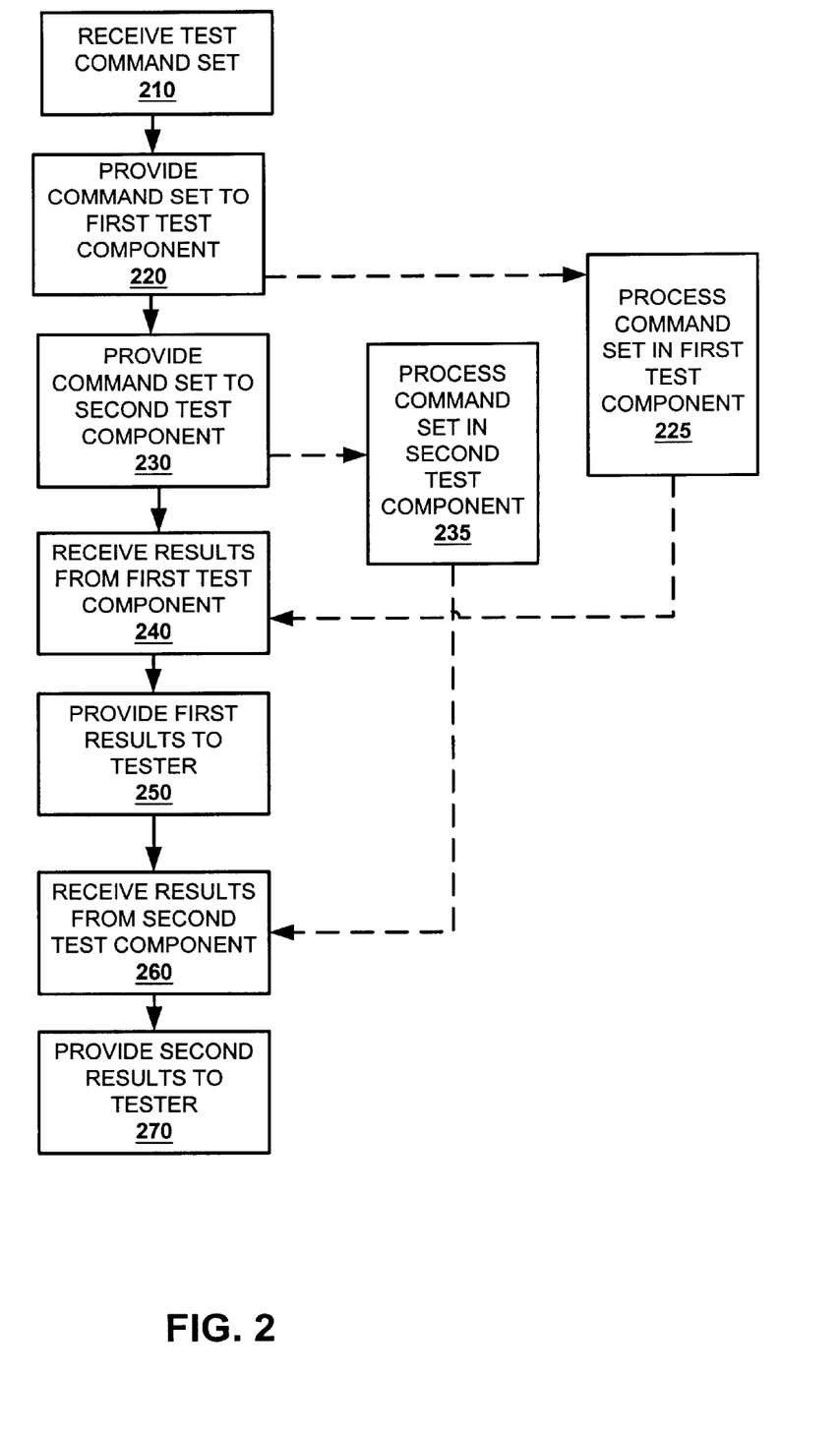
FIG. 2 is a flow diagram illustrating a method of processing test commands to test multiple components through a single test socket, according to one embodiment of the present disclosure.

Referring now to FIG. 2, a flow diagram illustrating a method of processing test commands to test multiple components through a single test board socket is shown, according to one embodiment of the present disclosure. A host system generates commands for testing capabilities associated with a particular type of component. A bridge chip handles the commands, providing the commands to a plurality of test components for concurrent processing and returning results associated with the processing to the host system.

In step 210, the bridge chip receives a set of test commands. In one embodiment, the test commands are received through an AGP port on the host system. The test commands are generated by an application running on the host system. The set of test commands are used to determine a performance of devices, such as graphics processors. The performance of the device is used to ensure the device is operating within particular specifications. The host system may be capable of providing a variety of test command sets to test various aspects of operation. In one embodiment, the component being tested is a graphics-processing component, including a graphics processor and video memory. The test commands may be generated to test 3- or 2-dimensional graphing capabilities. For example, the graphics processor may be provided various commands to render a 3-dimensional object. The test commands may also include tests for video memory. For example, data may be written to video memory at a particular speed at which the graphics processor is expected to function in. A checksum on video memory may be used to determine if memory writes were successful.

In step 220, the test commands are provided to the first test component. In one embodiment, the set of test commands are provided through an AGP interface between a test fixture with a bridge chip and the first test component. In one embodiment, the test commands are addressed within the host system. Addresses can be attached to the test commands indicating which of any interfaced test components a particular set of test commands are intended for. In one embodiment, an AGP addressing scheme is used to address test components to be tested. Alternatively to providing individually addressed commands, the set of commands may be broadcast by the bridge chip, providing copies of the set of test commands to each connected test components. In step 225, the first test component begins to process the set of test commands. In one embodiment, particular sets of addresses are grouped into zones. A first zone is used to provide commands to a first test component. A second zone is used to provide commands to a second test component. A third zone is used to indicate to the bridge chip to provide the commands to both the first and the second test components.

In step 230 the bridge chip provides the set of test commands to the second test component. The set of test commands provided to the second test component may be functionally equivalent to the set of test commands provided to the first test component. In one embodiment, the test commands provided to the second test component are a copy of the commands received from the host system. In step 235, the second test component begins to process the commands provided by the bridge chip. The second test component processes the set of test commands, while the first test component processes the test commands. However, processing in the second test component may be considered asynchronous to processing in the first test component. Processing in one test component is performed independent of processing in other test components, allowing the test components to be tested as separate systems.

In step 240, the test fixture, with the bridge chip, receives results from the processing performed in the first test component, once the first test component has completed the processing. In step 250, the bridge chip provides the results from the first test component to the host system. In one embodiment, the bridge chip attaches an address identifier to the results to allow the host system to identify the results as coming from the first test component.

In step 260, the bridge chip receives a set of results from the processing performed in the second test component, after the second test component has completed the processing associated with the set of test commands. In step 270, the bridge chip provides the results from the second test component to the host system. As previously discussed, the bridge chip may attach an address for the host system to identify the results as coming from the second test component. The host system may compare the results associated with the first and the second test components to known results to determine if the first or second test components are operating within specified parameters. In one embodiment, the test components include separate portions. For example, a first portion may include a graphics processor and a second portion may include video memory. The host system may use the results to determine if specific portions of the first and second test components are operating properly. In one embodiment, the host system also sends controls to a handler to insert new components to automatically test new components once an older test is complete. For example, once the results of the first and second test components have completed, the host system may send a command to a handler to replace them with a new set.

Figure 3:
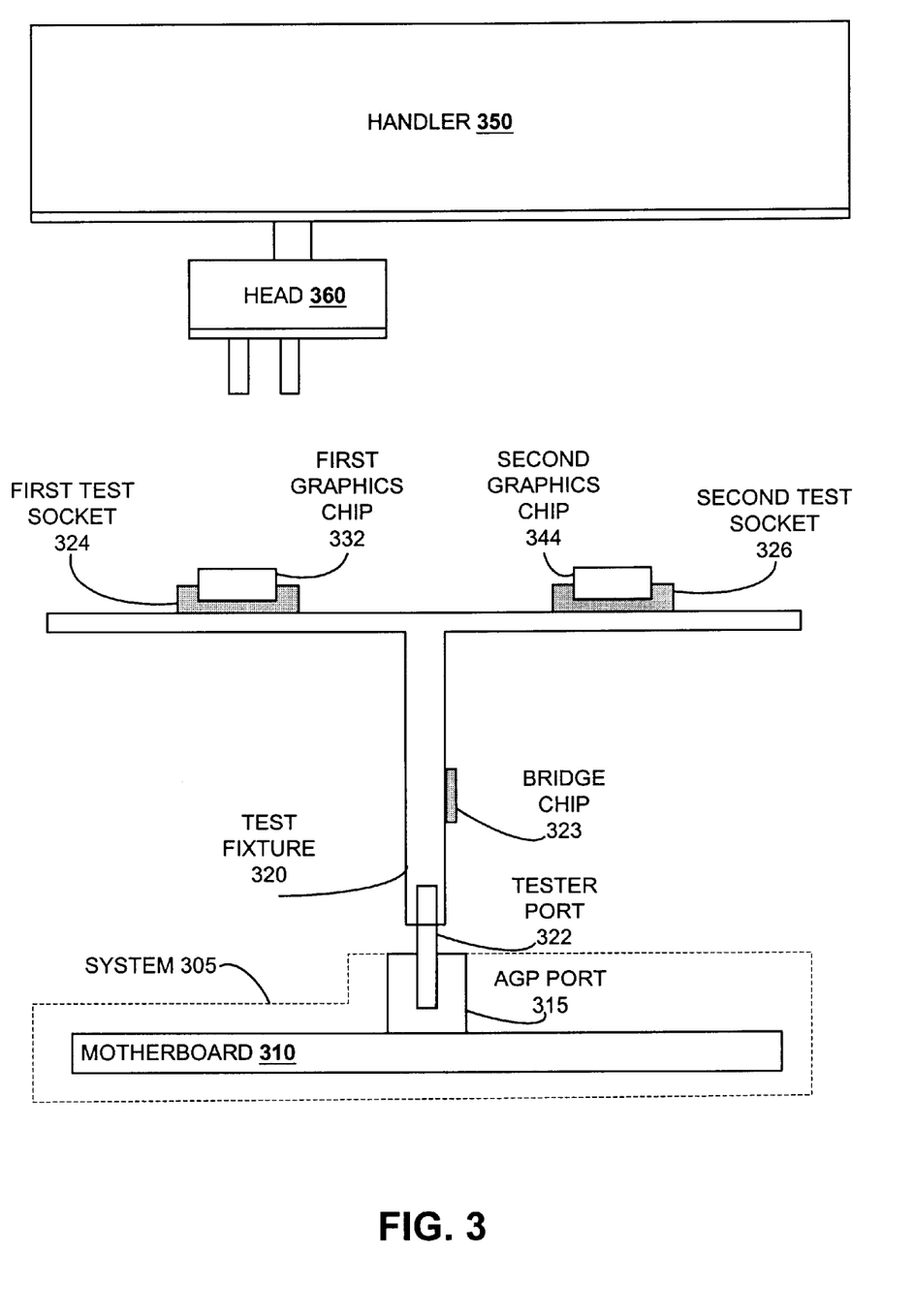
FIG. 3 is a side view of a test fixture dual head to provide access of components to a test handler, according to one embodiment of the present disclosure.

Referring now to FIG. 3, a side view of a test fixture being used to provide access of components to a test handler is shown, according to one embodiment of the present disclosure. A test fixture 320 is used to receive test commands provided through a tester port 322 on a motherboard 310 of a host system 305. The test fixture provides commands to a plurality of test components, such as first graphics chip 332 and second graphics chip 344, and returns processing results to AGP socket 315 for host system 305 to interpret.

Host system 305 generates test commands for testing processing in graphics chips 332 and 344. In one embodiment, the test commands are associated with routines for testing particular components portions of graphics chips 332 and 344. For example, rendering commands may be sent to test graphics processing capabilities of first graphics chip 332 and second graphics chip 344. Alternatively, commands may be sent to test memory associated with first graphics chip 332 and second graphics chip 344. Host system 305 includes a motherboard 310 with an AGP port 315 for testing components designed for use with AGP graphics cards, such as graphics chips 332 and 344.

To allow multiple test components to be tested concurrently, a test fixture 320 interfaces between the host system 305 and first and second graphics chips 332 and 344. Test fixture 320 includes a tester port 322 to interface with an AGP port 315 on motherboard 310 of host system 305. A bridge chip 323 receives sets of commands from tester port 322. The bridge chip 323 provides the commands to device ports, such as first test socket 324 and a second test socket 326. In one embodiment, first and second test sockets 324 and 326 are AGP sockets. First and second graphics chips 332 and 344 may include AGP circuit board components interfaced to first and second test socket 324 and 326, respectively. Accordingly, bridge chip 323 can provide a first set of commands to first graphics chip 332 for processing. Bridge chip 323 may then provide a second set of commands to second graphics chip 344. In one embodiment, the first and second sets of commands are copies of the commands received by bridge chip 323 from host system 305. Bridge chip 323 receives any data associated with processed commands from first and second graphics chips 332 and 344. Bridge chip 232 then provides the returned data to host system 305. Test sockets 324 and 326 might include chips sockets matching interfaces of first and second graphics chips 332 and 344. It should be noted that other forms of interfaces may also be used. In one embodiment, test sockets 324 and 326 include AGP sockets interfaced with AGP circuit boards associated with first and second graphics chips 332 and 344. It should be appreciated that other types of sockets may be used without departing from the scope of the present disclosure.

In one embodiment, test fixture 320 supports first and second graphics chips 332 and 344 in a horizontal manner, allowing access to first and second graphics chips 332 and 344 for handler 350. In one embodiment, handler 350 includes a head 360 for removing and attaching components to test fixture 320, such as graphics chips 332 and 344. In one embodiment, once host system 305 receives the data returned by bridge chip 323 and analyses the results from testing a particular test component, such as first test component 332, the host system 305 sends a control signal to handler 350. The control signal controls handler 350 to replace the particular test component that has been tested, as described further in reference to FIG. 4. In one embodiment, graphics chips 332 and 344 are held in a vertical manner, providing access for handler 350 to add and remove test components.

In one embodiment, a pitch, or distance, between components, such as first graphics chip 332 and second graphics chip 344 is provided by test fixture 320 to allow head 360 of handler 350 to appropriately add and remove components. A distance between test sockets 324 and 326 may be arranged on test fixture 320 to allow a minimum pitch to be realized, so that a maximum number of test components may be placed together in a fixed space and still provide access for head 360 of handler 350 to replace components.

In another embodiment, multiple test fixtures, such as test fixture 320, are connected together to allow more test components to be tested. For example, a second test fixture (not shown), similar to test fixture 320, with a tester port, similar to tester port 322, may interface directly to first test socket 324 through the tester port of the second test fixture. A third test fixture may similarly interface directly to second test socket 326, allowing other test components to be interfaced with the second and third test fixtures. Alternatively, a test fixture, such as test fixture 320 may include more test sockets to allow more test components to be tested. The bridge chip 323 may be used to process commands to the entire set of test sockets provided by one or more test fixtures.

Figure 4:
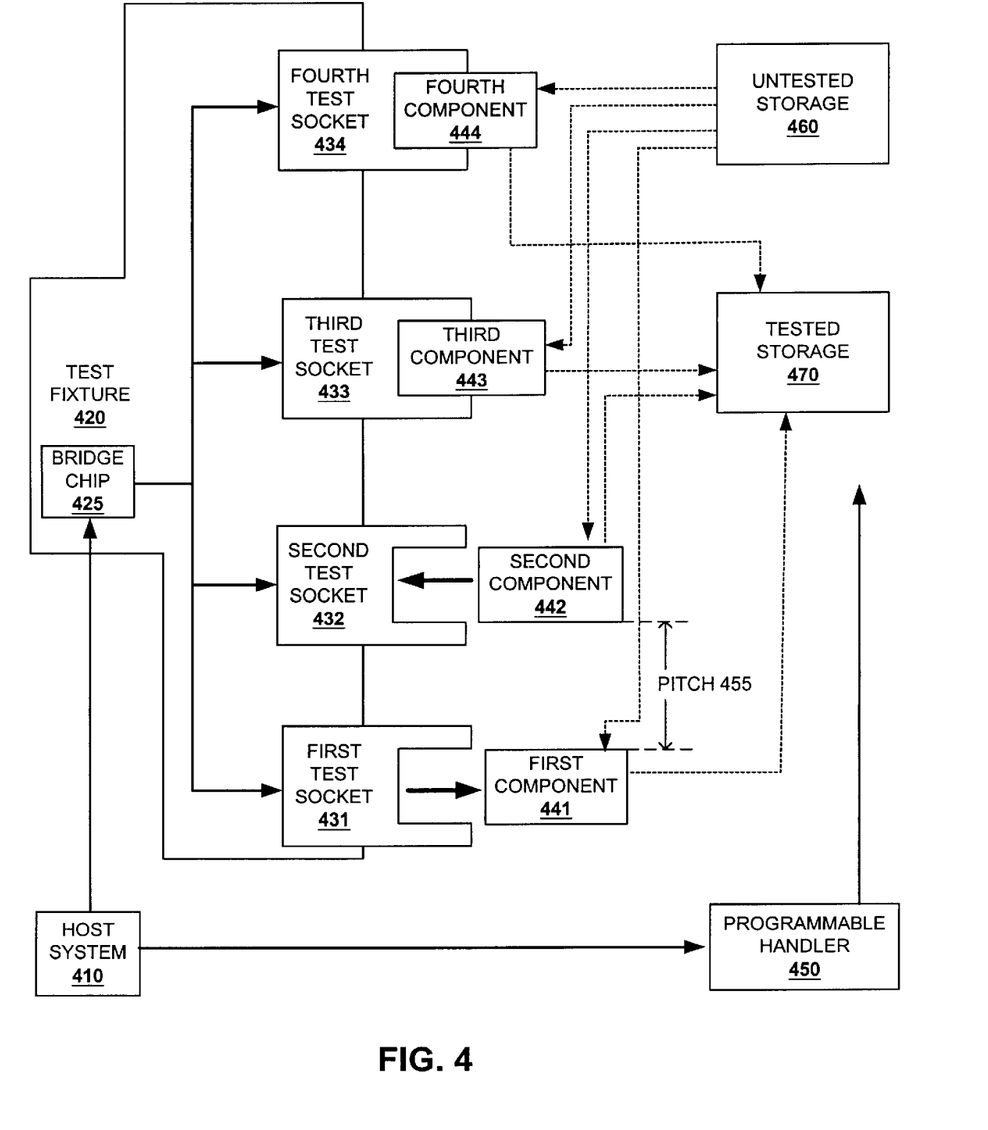
FIG. 4 is a block diagram illustrating a system for replacing components being tested using a single host system, according to one embodiment of the present disclosure.

Referring now to FIG. 4, a block diagram illustrating a system for interchanging components for testing using a single host system is shown, according to one embodiment of the present disclosure. A host system 410 generates commands for testing components 441-444 interfaced with test sockets 431-434, respectively. A test fixture 420 allows a plurality of test components such as components 441-444 to be interfaced and accept commands through a single socket of host system 410. Once tests are completed for a particular component, host system 410 sends a control signal to programmable handler 450 to replace a recently tested component with an untested component.

In one embodiment, host system 410 is an information handling system that includes system specifications matching those of a system in which components 441-444 will generally be used. For example, in one embodiment, host system includes components of a general desktop computer system or a video gaming system. Host system 410 includes an application for testing components 441-444. Components 441-444 may include graphics processors. Accordingly, host system 410 may generate commands associated with a test routine to test graphics processing capabilities, such as text mapping or 3-dimensional object rendering. Components 441-444 may also include memory devices. Accordingly, host system 410 may generate commands to test the memory devices. For example, host system may force components 441-444 to store and read back data at a particular speed to determine whether the components 441-444 are able to operate at such a speed. A checksum may be returned by the components 441-444 to determine if the writes were successful.

Commands generated by host system 410 are provided to test fixture 420, such as through an AGP interface. Test fixture 420 includes a bridge chip 425 to receive the commands and provide them to the plurality of test sockets 431-434. The bridge chip 425 provides a first set of commands to first component 441. As first component 441 processes the set of commands, bridge chip 425 provides a set of commands to second component 432. As second component 442 processes the set of commands, bridge chip 425 provides a set of commands to third component 443. Similarly, bridge chip 425 provides a set of commands to fourth component 444.

In one embodiment, host system 410 generates separate sets of commands. Each set of commands is addressed to an individual test socket 431-434. Accordingly, bridge chip 425 provides the sets of commands to each test socket 431-434 according to an address specified by the set of commands. In an alternate embodiment, a single set of commands is provided to bridge chip 425. Bridge chip 425 then provides copies of the set of commands to each of the test sockets 431-434. In one embodiment, bridge chip 425 provides the sets of commands to each of the test sockets 431-434 in a round robin configuration, in which a first copy of the set of commands is provided to the first test socket 431. The bridge chip then provides a second copy of the set of commands to the second test socket 432. The third and fourth test sockets 433 and 434 are then provided a third and fourth copy of the set of commands, respectively.

The components 441-444 process the sets of commands concurrently and independently of each other. Each of the components 441-444 receives the test commands and provides test results through test sockets 431-434, respectively. Once each of the components 441-444 has completed processing their respective sets of commands, results are returned to the host system 410, through test fixture 425. Test fixture 425 receives the results from each of the test sockets 431 and 434 in turn and provides the results to host system 410. In one embodiment, bridge chip 425 attaches an identifier to each of the returned results, allowing the host system 410 to identify each of the results from each of the components 441-444.

A programmable handler 450 may be used to replace tested components with untested components. In one embodiment, once host system 410 has analyzed the returned results associated with a particular component, host system 410 sends a control signal to programmable handler 450. The control signal is used to program programmable handler 450 to remove a tested component, such as component 441. The programmable handler 450 places the component in a tested storage 470, which may include a storage bin or collection of storage bins for collecting tested components. The programmable handler 450 may then get a new, untested component from untested storage 460 and place the new component on one of the test sockets 431-434.

In one embodiment, tested storage 470 includes several levels for categorizing tested components. For example, one level, or bin, may be used to collect test components with memory portions that have passed the test routines generated by host system 410. Another level may be used to collect test components with portions which have passed graphics processing testing. Tested storage 470 may also include components that have passed some tests, but failed others. Another level may also be used to collect components that have failed the test routines generated through host system 410. It should be appreciated that other levels or bins may be included in untested storage 460 and tested storage 470 without departing from the scope of the present disclosure. By providing control signals to programmable handler 450, new components may be attached to test sockets 431–434 for testing. Accordingly, host system 410 may be used to run an automated test system, in which once old components have been tested, new components may be added and tested.

In one embodiment, a distance between components, such as pitch 455 between first component 441 and second component 442, is arranged by test fixture 420 to allow a minimum distance between components, such as components 441 and 442, and still provide access to the components to programmable handler 450. By minimizing the pitch, the number of components, such as components 441–444, which may be tested in an automated system, may be increased. Typically, values for pitch 455 include 80 mm to 120 mm. It will be appreciated that other pitch values may be used without departing from the scope of the present disclosure.

Figure 5:
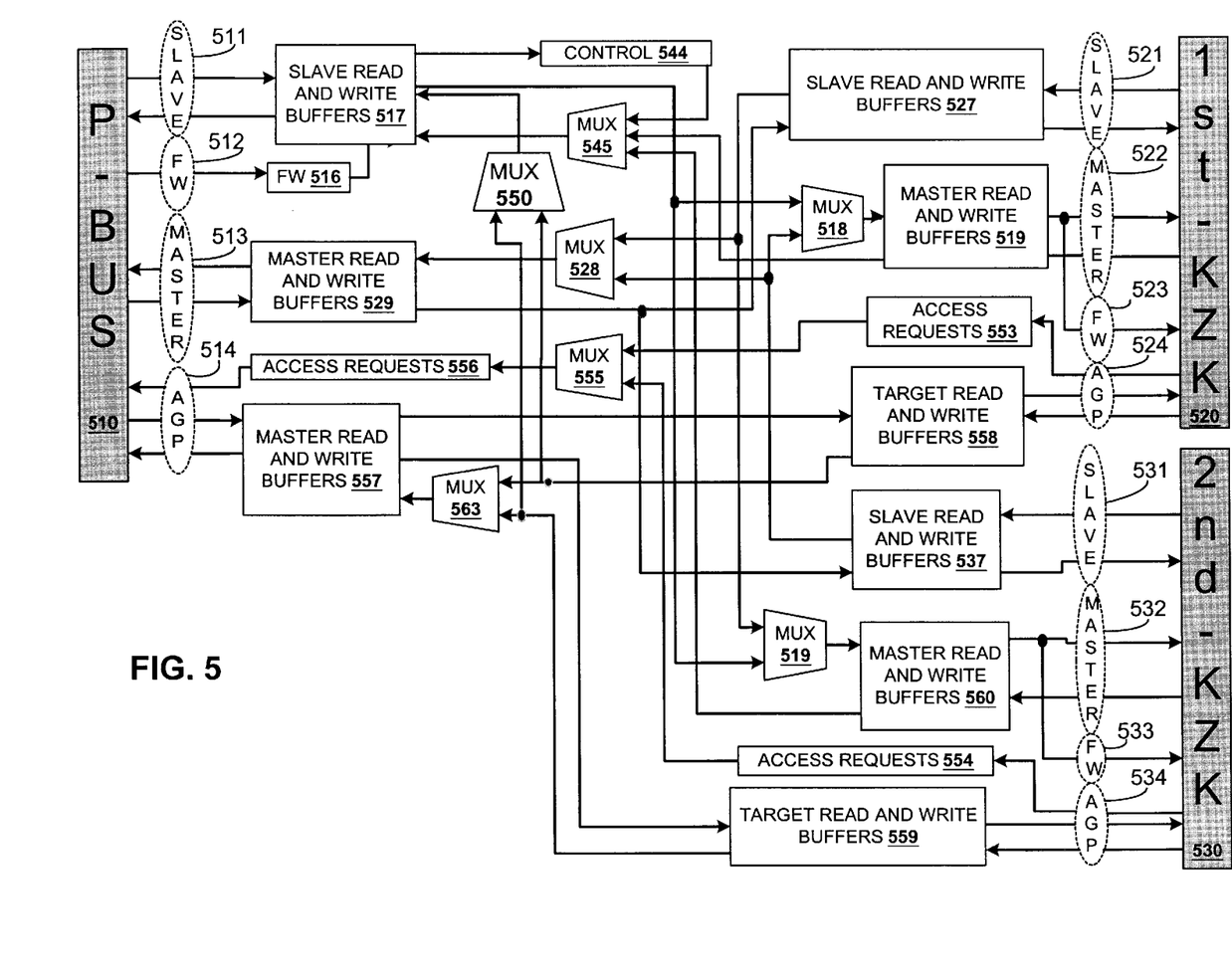
FIG. 5 is a block diagram is shown describing data paths within a bridge chip used for routing commands from a single AGP interface to a plurality of AGP interfaces, according to one embodiment of the present disclosure.

Referring now to FIG. 5, a block diagram describing data paths within a bridge chip used for routing commands from a single AGP interface to a plurality of AGP interfaces or sockets is shown, according to one embodiment of the present disclosure. Generally, an AGP bus is used to provide point-to-point communications between an information handling system and a graphics card with a single graphics processor, wherein the graphics processor is considered a master device and initiates AGP communications. To allow multiple graphics processors to communicate over the AGP port, the bridge chip routes AGP commands.

An AGP bus, such as central bus 210, is a superset of the PCI bus. Commands between the AGP bus and an interfaced graphics card are passed according to general PCI specifications. The AGP bus provides dedicated address and data lines for processing memory transfers between the system memory of the information handling system and video memory of the interfaced graphics card. The AGP bus is generally designed to allow memory transactions to be passed at a speed capable of reaching the full available bandwidth of the system memory. The memory transactions between the information handling system and the interfaced graphics card allow graphics data, such as textures, to be stored in system memory and transferred to the graphics card as needed by the graphics card. By allowing the textures to be stored in system memory, a number of textures that are to be used by a software graphics application are not limited to a number of textures that can be fit into the memory of the graphics card.

To allow memory transactions to be handled at higher speeds than the PCI bus transactions, AGP specifications are designed to only allow a single AGP master device to be interfaced with the AGP bus. The interfaced graphics processor initiates all AGP memory transactions. The memory transactions are provided in a point-to-point manner, providing a dedicated memory channel, through the AGP bus, between the interfaced graphics processor and the system memory. While memory transactions are handled using AGP protocols and dedicated address and data lines, PCI protocols are used for transferring general communications and commands between the information handling system and the interfaced graphics card. AGP specifications also allow for fast-write operations, in which PCI communications through the AGP bus are handled at higher speeds than normal PCI communications.

For test purposes it is desirable to interface multiple graphics processors or graphics-processing components to the single AGP interface, such as central bus 510. The bridge chip routes communications between central bus 510 to a first bus 520 and a second bus 530. In one embodiment, a set of multiplexers 518, 519, 528, 545, 550, 555 and 563 are used to route commands and data between buses 510, 520 and 530. Each of the buses 510, 520 and 530 include PCI and AGP control lines. For example, central bus 510 includes PCI control lines for PCI slave control signals 511 and PCI master control signals 513. Central bus 510 also includes AGP control lines for AGP control signals 514 and a fast-write line 512 for passing a fast-write enable signal 516. The first bus 520 and the second bus 530 include similar control lines. First bus includes PCI control lines for PCI slave control signals 521 and PCI master control signals 522, AGP control lines for AGP control signals 524 and a fast-write line 524 for receiving the fast-write enable signal 516 generated through fast-write line 512. Second bus 530 includes PCI control lines for PCI slave control signals 531 and PCI master control signals 522, AGP control lines for AGP control signals 534 and a fast-write line 533 for receiving the fast-write enable signal.

PCI protocols provide for devices as operating in either master or slave configurations, allowing either the information handling system or interfaced graphics cards to operate as master devices and generate PCI commands. When the information handling system is operating as a PCI master device, the information handling system, issues commands to a PCI slave, through the PCI slave control lines 511 of central AGP bus 511. Data to be written to a PCI slave device are sent to a write buffer of PCI slave read and write buffers 517. The data includes an address identifying the device being written. In one embodiment, a state machine (not shown) attached to the PCI slave read and write buffers 517 determines whether to send the data to the first AGP bus 520 or the second AGP bus 530, or to both buses 520 and 530. The determination may be made according to an address attached to the data. In one embodiment, the bridge chip identifies a first set of addresses as belonging to first AGP bus 520, a second set of addresses as belonging to second AGP bus 520, and a third set of addresses as belonging to both buses 520 and 530. The information handling system may also provide commands for a control unit 544 of the bridge chip. The commands may set particular settings of the bridge chip, such as selecting between a broadcast mode where a single command is sent to both buses 520 and 530, or a re-mapping mode where commands are addressed to either the first AGP bus 520 or the second AGP bus 530.

Slave write commands are provided to a first multiplexer 518 associated with the first AGP bus 520, and a second multiplexer 519, associated with the second AGP bus 530. Multiplexers 518 and 519 also accept data from other available buses. For example, multiplexer 518 accepts data from second AGP bus 530. Similarly, multiplexer 519 accepts data from first AGP bus 520. Data passed by multiplexer 518 is passed to a master write buffer of PCI master read and write buffers 529. The data may then be passed to a first graphics processor, such as first graphics chip 332 (FIG. 3), interfaced with first AGP bus 520, through PCI master control lines 522. In one embodiment, a state machine interfaced with the PCI master read and write buffers 519 is used to re-map addresses included with the data as well as provide a fast write signal to the fast-write line 523. Second multiplexer 519 passes data to PCI master read and write buffers 560. The data may then be sent to a second graphics card interfaced with second AGP bus 530, through PCI master control lines 532. A fast-write enable signal may also be provided through fast-write control line 533.

Data retuned to the central AGP bus is passed from read buffers of PCI read and write buffers 519 and 560 from first AGP bus 520 and 530, respectively. The data is routed to a multiplexer 545, along with any information returned by the bridge chip, through control unit 544. Multiplexer 545 may then be used to select one of the sets of received data to store in a read buffer of PCI slave read and write buffers 517 for the information handling system, through slave control lines 511 of central AGP bus 510. In one embodiment, the bridge chip attaches unique identifiers to each of the data to allow the information handling system to identify which of the interfaced graphics processors the data came from.

If the information handling system is operating as a PCI slave device, data to be written to the information handling system is provided through write buffers of PCI slave read and write buffers 527 and 537. The data is generated through the first and second graphics cards and provided through slave control lines 521 and 531 of first bus 520 and second bus 530, respectively. The data is then routed from the write buffers of PCI slave read and write buffers 527 and 537 to multiplexer 528. The multiplexer 528 selects among the received sets of data to provide one set at a time to a master write buffer of PCI master read and write buffers 529. The data may then be passed to the information handling system through master control lines 513. Data sent back to the first and second graphics processors are provided to a master read buffer of PCI master read buffers 529. The data may then be routed to either PCI slave read and write buffers 527 for transfer to the first graphics processor connected to first AGP bus 520, to PCI clave read and write buffers 537 for transfer to second graphics processor, such as second graphics chip 344 (FIG. 4), connected to second AGP bus 530, or to both slave read and write buffers 527 and 537.

A first set of AGP access requests 553 are provided to multiplexer 555, through first AGP bus 520. A second set of AGP access requests 554 are provided to multiplexer 555, through second AGP bus 530. Multiplexer 555 selects a single set of AGP requests 565 from the received sets of access requests 553 and 554. The multiplexer 555 may select the single set of access requests 565 in a round robin manner in which the first set of AGP requests 553 is selected once and then the next set is taken from the second set of access requests 554. The single set of access requests 565 is then provided to the information handling system through AGP control lines 514 of the central AGP bus 510.

Data written to the information handling system may be provided from first AGP bus 520, through a write buffer of AGP target read and write buffers 558, or from second AGP bus 530, through a write buffer of AGP target read and write buffers 559. The data may be sent from the AGP read and write buffers 558 and 559 to a multiplexer 563. The multiplexer 563 selects from the sets of received data to provide a single set of data at a time to a write buffer of master read and write buffers 557. The data may then be passed to the information handling system, through AGP control lines 514. The data from AGP target read and write buffers 558 and 559 may also be provided to a multiplexer 550. Multiplexer 550 then provides the data to PCI slave read and write buffers 517 for transfer to the information handling system.

Data returned by the information handling system may be stored in read buffers of master read and write buffers 557. The data may then be sent to either first AGP bus 520, through AGP target read and write buffers 558, second AGP bus 530, through AGP target read and write buffers 559, or to both AGP target read and write buffers 558 and 559. In one embodiment, the data is routed depending on address identifiers associated with the data. As previously discussed, in one embodiment, the AGP control lines 514, 524, and 534 are only used for transferring data between system memory of the information handling system and local memory of the first and second graphics processors. It should be appreciated that other methods for routing commands between the information handling system and interfaced graphics processing components may be used without departing from the scope of the present disclosure.

The systems described herein may be part of an information handling system. The term "information handling system" refers to any system that is capable of processing information or transferring information from one source to another. An information handling system may be a single device, such as a computer, a personal digital assistant (PDA), a hand held computing device, a cable set-top box, an Internet capable device, such as a cellular phone, and the like. Alternatively, an information handling system may refer to a collection of such devices. It should be appreciated that the system described herein has the advantage of concurrently testing multiple AGP graphics components using a single host processing system.

In the preceding detailed description of the embodiments, reference has been made to the accompanying drawings which form a part thereof, and in which is shown by way of illustration specific embodiments in which the disclosure may be practiced. These embodiments are described in sufficient detail to enable those skilled in the art to practice the disclosure, and it is to be understood that other embodiments may be utilized and that logical, mechanical and electrical changes may be made without departing from the spirit or scope of the disclosure. To avoid detail not necessary to enable those skilled in the art to practice the disclosure, the description may omit certain information known to those skilled in the art. Furthermore, many other varied embodiments that incorporate the teachings of the disclosure may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the disclosure. The preceding detailed description is, therefore, not to be taken in a limiting sense, and the scope of the present disclosure is defined only by the appended claims.

What is claimed is:

1. A method comprising:

positioning a plurality of components to be tested, separate components of the plurality of components being designed to operate within separate circuits and the separate circuits having interface ports configured to be connected to a host system port;

coupling the separate components to a test fixture, the test fixture having a tester port configured to connect to the host system port;

connecting the tester port to the host system port;

providing one or more test commands to a bridge chip of the test fixture via the tester port, wherein the bridge chip is operably coupled to the interface ports; and providing the one or more test commands from the bridge chip to the plurality of components via the interface ports.

2. The method as in claim 1, further including providing at least a first test result to the host system, wherein the first test result is associated with a processing of the one or more test commands in at least a first component of the plurality of components.

3. The method as in claim 1, further including providing a program instruction to a programmable handler for replacing at least a first component of the plurality of components with a new component once the at least a first component has completed processing the one or more test commands.

4. The method as in claim 1, wherein the tester port is an accelerated graphics port.

5. The method as in claim 1, wherein separate circuits include accelerated graphics port cards.

6. The method as in claim 1, wherein the one or more test commands are used to perform an at-speed test.

7. The method as in claim 1, wherein the one or more test commands are used to perform a memory test.

8. The method as in claim 1, wherein the plurality of components include graphics processors.

9. The method as in claim 1, wherein the plurality of components include memory devices.

10. The method as in claim 1, wherein the bridge chip broadcasts the one or more test commands to the plurality of components via the interface ports.

11. The method as in claim 1, wherein the bridge chip:
provides the one or more test commands to a first socket coupled to a first component; and provides the one or more test commands to a second socket coupled to a second component after providing the one or more test commands to the first socket.

12. A test fixture comprising:
a tester port configured to mate with a host port;
a plurality of device sockets configured to receive devices having interfaces configured to communicate with the host port; and
a bridge component having a first interface coupled to the tester port and a plurality of additional interfaces coupled to the plurality of device sockets.

13. The test fixture as in claim 12, wherein the bridge component is used to provide one or more test commands from the host port to the plurality of device sockets via the plurality of additional interfaces.

14. The test fixture as in claim 13, wherein the bridge component broadcasts the one or more test commands to all of the plurality of device sockets.

15. The test fixture as in claim 13, wherein the bridge component:
provides the one or more test commands to a first device socket of the plurality of device sockets; and
provides the one or more test commands to a second device socket of the plurality of device sockets after providing the one or more test commands to the first device socket.

16. The test fixture as in claim 13, wherein the one or more test commands include at-speed test commands.

17. The test fixture as in claim 13, wherein the one or more test commands include memory test commands.

18. The test fixture as in claim 12, wherein host port is an accelerated graphics port.

19. The test fixture as in claim 18, wherein the plurality of device sockets include sockets for accelerated graphics port devices.

20. The test fixture as in claim 12, wherein the devices include graphics processing components.

21. The test fixture as in claim 20, wherein the graphics processing components include graphics processors.

22. The test fixture as in claim 20, wherein the graphics processing components include memory components.

23. A system comprising:
a data processor having an input/output buffer;
memory having an input/output buffer coupled to the input/output buffer of the data processor, wherein the memory includes a tester application to:
generate one or more test commands for testing a plurality of devices;
receive one or more test results associated with a processing of the one or more test commands within the plurality of devices;
analyze the one or more test results to determine a validity of each device of the plurality of devices;
a host port having an input/output buffer coupled to the input/output buffer of the data processor;
a test fixture including:
a host interface for interfacing with the host port;
a plurality of sockets to interface with the plurality of devices, wherein the plurality of devices are used to process the one or more test commands;
a bridge component coupled to the host interface and the plurality of device ports, the bridge component to:
receive the one or more test commands generated by the tester application;
provide the one or more test commands to each socket of the plurality of sockets;
receive the one or more test results generated by the plurality of devices in processing the one or more test commands; and
provide the one or more test results to the host interface.

24. The system as in claim 23, wherein the tester application is further used to provide a program instruction to a programmable handler for replacing a particular device of the plurality of devices once a validity of the particular device has been determined.

25. The system as in claim 23, wherein the plurality of devices include components to be tested using the one or more test commands.

26. The system as in claim 25, wherein the devices include graphics processors.

27. The system as in claim 25, wherein the devices include memory components.

28. The system as in claim 25, wherein the tester application is further used to provide a program instruction to a programmable handler for replacing a component of a particular device from the plurality of devices once a validity of the particular device has been determined.

29. The system as in claim 23, wherein the bridge component broadcasts the one or more test commands from the host interface to the plurality of sockets.

30. The system as in claim 23, wherein the bridge component is used to:
provide at least a first command of the one or more test commands to a first socket of the plurality of sockets; and provide a second command of the one or more test commands to a second socket of the plurality of sockets after providing the at least a first command to the first socket.

31. A test apparatus comprising:
   a first test fixture comprising:
      a first tester port configured to mate with a host port;
      a first plurality of device sockets configured to receive devices having interfaces configured to communicate with the host port; and
      a first bridge component having a first interface coupled to the first tester port and a first plurality of additional interfaces coupled to the first plurality of device sockets; and
   a second test fixture comprising:
      a second tester port configured to mate with a device socket of the first plurality of device sockets;
      a second plurality of device sockets configured to receive devices having interfaces configured to communicate with the host port; and
      a second bridge component having a first interface coupled to the second tester port and a second plurality of additional interfaces coupled to the second plurality of device sockets.

32. The test apparatus as in claim 31, wherein the first bridge component is used to provide one or more test commands from the host port to the first plurality of device sockets via the first plurality of additional interfaces and the second bridge component is used to provide the one or more test commands from the second tester port to the second plurality of device sockets via the second plurality of additional interfaces.

* * * * *